United States Patent [19]

Matt

[11] 4,380,967

[45] Apr. 26, 1983

[54] SYSTEM FOR AUTOMATICALLY COATING OBJECTS WITH A PLURALITY OF QUANTITIES OF A COATING MATERIAL USING A SINGLE DISCHARGE APPARATUS

[75] Inventor: Timothy S. Matt, Bay Village, Ohio

[73] Assignee: Nordson Corporation, Amherst, Ohio

[21] Appl. No.: 301,520

[22] Filed: Sep. 14, 1981

[51] Int. Cl.[3] ........................ B05C 11/00; H03K 17/26

[52] U.S. Cl. .................................... 118/669; 118/703; 328/73; 328/75; 328/129.1

[58] Field of Search .................. 118/669, 703; 328/73, 328/75, 129

[56] References Cited

U.S. PATENT DOCUMENTS 3,340,847 9/1967 Miller et al. .
3,682,131 8/1972 Algeri et al. .
3,688,735 9/1972 Brenner .
3,862,414 1/1975 Algeri .
4,166,246 8/1979 Matt .

*Primary Examiner*—Bernard D. Pianalto
*Attorney, Agent, or Firm*—Wood, Herron & Evans

[57] ABSTRACT

A coating system for automatically discharging a coating material from a nozzle onto objects moving relative to the nozzle in a path past the nozzle. Each object receives two separately located quantities of the coating material from the single nozzle. A first sensor detects the presencc of an object at a first point upstream of the nozzle, and a second sensor detects the presence of the object at a second point downstream of the first point and yet upstream of the nozzle. A delay timer is responsive to either of the sensors to produce a delay signal after a delay time corresponding to a predetermined distance of travel by the sensed object. A duration timer is responsive to the delay signal to produce a duration signal for a duration time corresponding to a predetermined distance of travel by the sensed object. The duration signal is used to create a control signal for effecting discharge of the coating material from the nozzle onto each object.

5 Claims, 4 Drawing Figures

SYSTEM FOR AUTOMATICALLY COATING OBJECTS WITH A PLURALITY OF QUANTITIES OF A COATING MATERIAL USING A SINGLE DISCHARGE APPARATUS

DESCRIPTION OF THE INVENTION

This invention relates to automatic coating systems for the timed discharge of a coating material upon objects as they are moved in relation to a coating station which has a discharge device dispensing the coating material. More particularly, the invention concerns such systems in which more than one quantity of a coating material is applied to each object.

In various types of coating systems, series of objects are moved sequentially relative to a coating station at which a coating material is discharged from a discharge nozzle and deposited upon the objects as they move past the station. Such coating systems include spray systems for paints and varnishes and the like, and also adhesive application systems such as for the discharge of a hot melt adhesive onto objects moving past an adhesive dispensing station.

In such coating systems, controls are employed to intermittently actuate a coating material discharge apparatus so that the coating material is deposited only upon a certain portion of each object when the object is at a predetermined position relative to the discharge apparatus. Typically, a sensor is positioned upstream of the coating station along the path of travel of the objects to be coated to sense the presence of an object at a particular position relative to the coating station. The sensor is connected through a time delay device to control the operation of the discharge apparatus. This time delay device accounts for the time lag between the sensing of the object and the subsequent positioning of the object at the coating station. An additional timing device is provided to control the duration of the coating material discharge operation.

In many coating systems, more than one quantity of coating material must be applied to each object. For example, a metal part may require the application of paint in two non-adjacent areas, or a cardboard carton blank may require the application of two separate beads of adhesive. Normally, to accomplish this, there is provided a separate sensor, timing device arrangement, and coating material discharge apparatus for each of the quantities of coating material to be applied.

One such situation is a system for applying hot melt adhesive to the leading and trailing flaps of a cardboard carton prior to its closure. Typically in these systems, a sensor detects the leading edge of the leading flap of the carton to activate a first pair of timing devices for delay and duration, which in turn control the application of adhesive from a first dispensing apparatus onto the leading flap of the carton. For each carton, a second sensor senses the trailing edge of the trailing flap of the carton activating a second pair of timing devices for delay and duration, which in turn actuate a second adhesive dispensing apparatus to place a bead of adhesive on the trailing flap of the carton. Usually, the leading and trailing flaps are of the same width although the overall carton sizes may vary.

It can be appreciated that the provision of a second timing arrangement and a second adhesive dispensing apparatus is expensive. As a consequence, it is the general aim of the invention to reduce the cost and the number of elements in systems of the foregoing type. Accordingly, the present invention is predicated in part upon the provision of a coating application system of the type that applies multiple quantities of a coating material to individual objects in which a single delay and duration timer and a single discharge apparatus are employed.

In carrying out the invention, in a coating system having means for discharging a coating material from a nozzle onto objects moving relative to the nozzle in a path past the nozzle, a first sensor is positioned along the path to detect the presence of an object at a first point upstream of the nozzle, and a second sensor is positioned to detect the presence of an object at a second point which is downstream of the first point and upstream of the nozzle. A delay timer is responsive to either of the sensors to produce a delay signal after a delay time corresponding to a predetermined distance of travel by a sensed object on the path, and a duration timer is responsive to the delay signal to produce a duration signal for a duration time corresponding to a predetermined distance of travel by a sensed object on the path. The delay timer and the duration timer are operable to function simultaneously so that a delay time initiated by one sensor may be established at the same time as a duration time which was initiated by the other sensor. The sensors are positioned along the path so that the first and second points of detection of the object are spaced apart a distance sufficient to account for the delay time. In this manner, a sensor signal from one of the sensors will not be generated during the delay time initiated by the other sensor, preventing interference in the operation of the delay timer.

Further objects and advantages of the invention will become apparent upon reading the following detailed description and upon reference to the drawings, in which:

DETAILED DESCRIPTION OF THE DRAWINGS

Figure 1:
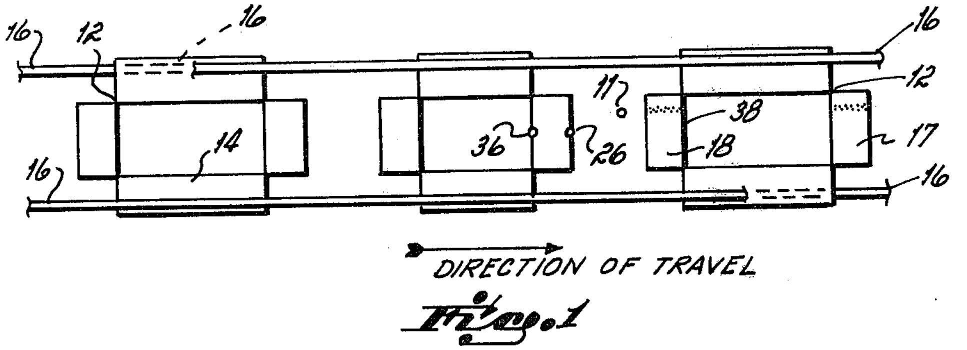
FIG. 1 is a diagrammatic top view of a series of cartons moving past a hot melt adhesive application station.
Figure 2:
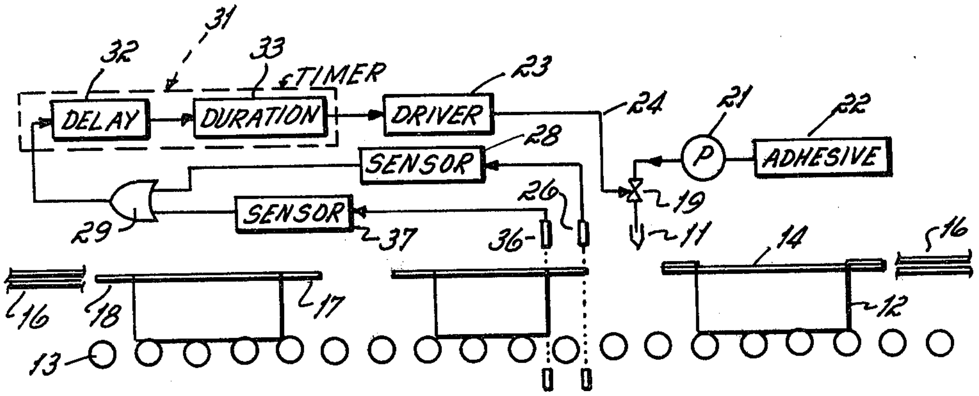
FIG. 2 is a diagrammatic side view of the cartons and adhesive dispensing station of FIG. 1 additionally showing in block diagram form the control elements for the dispensing station.

Referring initially to FIGS. 1 and 2, a hot melt adhesive application system includes a nozzle 11 for dispensing adhesive onto cardboard cartons 12. The cartons are moved past the nozzle 11 by two pairs of belts 16 which grip the lateral flaps 14 of the cartons. The cartons are filled with cans or the like (not shown) and ride on rollers 13. As each carton is moved past the nozzle 11, the nozzle is activated to dispense hot melt adhesive onto the leading flap 17 and the trailing flap 18 of each carton.

The adhesive is supplied through the nozzle 11 by the controlled actuation of a valve 19 through which hot melt adhesive is pumped by a pump 21 from a hot melt adhesive tank 22. The valve 19, which is preferably a solenoid controlled valve, is opened by a control signal supplied from a solenoid driver circuit 23 on a line 24.

In order to apply adhesive to the leading flap 17 of a carton 12, the leading edge of the flap 17 is sensed at a point upstream from the nozzle 11, and after a suitable time delay, the valve 19 is opened for a sufficient duration to apply a bead of adhesive across the leading flap. The leading edge of the flap 17 is detected by a photosensor 26 whose reception of light from a light source 27 is broken by the leading edge of the flap. The photosensor 26 is typically a phototransistor exhibiting a marked impedance change in the absence of light from the light source 27. This impedance change is converted to a sensor signal by a sensor wave shaping circuit 28, which also serves to eliminate noise and other spurious signals. The sensor signal is coupled through an OR gate 29 to a timer arrangement 31 which comprises a delay timer 32 and a duration timer 33 in series connection.

In the illustrated system, the conveyor 13 moves the cartons at a constant speed so that there is a direct correlation between time and distance of travel along the conveyor path. Since the adhesive-dispensing nozzle 11 is spaced apart from the leading edge sensor 26, a delay must be introduced to allow the leading edge of the flap to move along the conveyor path to a point at which it is beneath the nozzle 11. This delay time is provided by the delay timer 32. Since the conveyor speed is constant and known, and the distance between the sensor 26 and the nozzle 11 is known, the necessary delay time is determined and this amount of time is preset to be counted down in the delay timer 32 for each carton.

Once the leading edge of the leading flap 17 has reached a position beneath the nozzle 11, the valve 19 must be opened for a period of time sufficient to allow a bead of adhesive to be applied across the entire width of the flap 17. In order to do this, a control signal from the driver 23 must be applied through the line 24 to the valve 19. The driver 23 produces this control signal in response to a duration signal from the duration timer 33. Again, since the speed of the conveyor and the width of the flap are known, the requisite duration time is determined and set in the duration timer 33. The duration timer begins the output of a duration signal upon receipt of the delay timer signal and continues to produce the duration signal for the countdown of the preset duration time. This duration timer output signal actuates the driver 23 to open the valve 19 for the duration time.

In accordance with the invention, the same timer arrangement 31, driver 23 and nozzle 11 are employed to apply a bead of adhesive to the trailing flap 18. In order to accomplish this, a second light source 34 and a second photosensor 36 are positioned upstream of the photosensor 26 and the light source 27. The photosensor 36 detects the trailing edge of the trailing flap 18 and cooperates with a sensor waveform shaping circuit 37 to provide a trailing edge sensor signal to the OR gate 29. The OR gate 29 in turn couples the sensor signal to the delay timer 32. As shall be discussed in more detail hereinafter, the same delay time which is preset in the delay timer 32 for the leading flap 17 is used to delay the activation of the valve 19 to permit the leading edge 38 of the trailing flap 18 to be positioned beneath the nozzle 11. The width of the trailing flap 18 is preferably the same as the width of the leading flap 17. Since the same duration time is produced by the duration timer 33 for both the leading and trailing flaps, a bead of adhesive of equal length is applied by the nozzle 11 in each case. If, as illustrated, a bead of adhesive is applied across the entire width of the leading flap, a bead of adhesive will also be applied across the entire width of the trailing flap.

The sensor signal shaping circuits 28 and 37 are substantially identical except that the circuit 28 operates in the "break light" mode and the shaping circuit 37 operates in the "make light" mode. Therefore, if similar photosensors 27 and 36 are used, the shaping circuit 28 or the shaping circuit 37 must include an inverting stage so that the two sensor signal inputs to the OR gate 29 are of the same polarity. For a positive logic OR gate, each of the sensor signals is a positive pulse. A suitable sensor pulse shaping circuit is disclosed in my co-pending U.S. patent application entitled COATING SYSTEM CONTROL HAVING A SENSOR INTERFACE WITH NOISE DISCRIMINATION, commonly assigned herewith.

The driver 23 is responsive to the duration signal from the duration timer 33 to open the valve 19 associated with the nozzle 11. The exact construction of the driver circuit is not critical to the invention and is, in fact, dictated to some degree by the type of valve 19 which is controlled.

Figure 3:
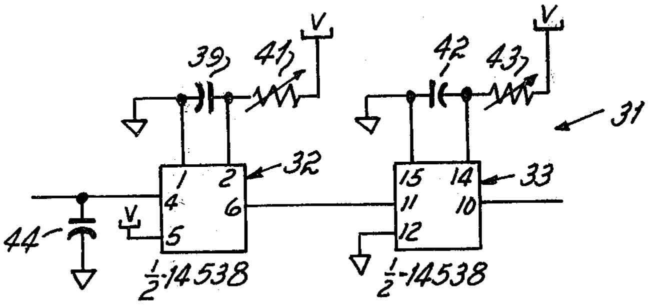
FIG. 3 is a partial schematic diagram of a timer for use in the system of FIG. 2.

A suitable delay and duration timer arrangement 31 is shown in FIG. 3. The delay timer 32 and the duration timer 33 each comprise one half of a dual precision retriggerable/resettable monostable multivibrator, Motorola type number MC14538B. The delay time for the delay timer 32 is determined by the RC time constant of a capacitor 39 and a potentiometer 41. The delay time is set by adjusting the potentiometer 41. A similar connection of a capacitor 42 and a potentiometer 43 permits the setting of the duration time for the duration timer 33. In actual practice, it is preferred to use an operational amplifier circuit to increase the effective capacitance of each of the capacitors 39 and 42. In this way the physical capacitors 39 and 42 actually used are smaller in value and less susceptible to drift in capacitance value. The capacitor 44 at the input to the delay timer 32 serves as a minimum pulse width filter to eliminate noise from the incoming sensor pulse line.

Returning now to FIGS. 1 and 2, it is apparent that certain distance relationships must be maintained in the system in order to obtain proper application of adhesive on the leading and trailing flaps. As was mentioned earlier, since the duration timer produces a consistent duration time signal, the leading flap 17 preferably has the same width as the trailing flap 18 if both beads of adhesive are to extend across the entire flap width. If the width of adhesive bead on the two flaps is not critical, then the flap widths could, of course, vary.

Independent of the duration timer considerations, it can be seen that the delay timer 32 will also produce a constant delay time regardless of which sensor input is received. In order for the delay timer to function properly, the delay time for the leading flap 17 must be completed prior to initiation of the delay time for the trailing flap 18. The delay timer is started by a sensor pulse initiated by either the sensor 26 or the sensor 36, and these sensor indications correspond to two different positions for a carton 12. These two sensed positions of a carton must, therefore, be spaced apart a distance great enough to account for the delay time. This will ensure that the delay timer 32 has timed out and reset for one sensed position of a carton before timing a delay for a subsequently sensed carton position.

Figure 4:
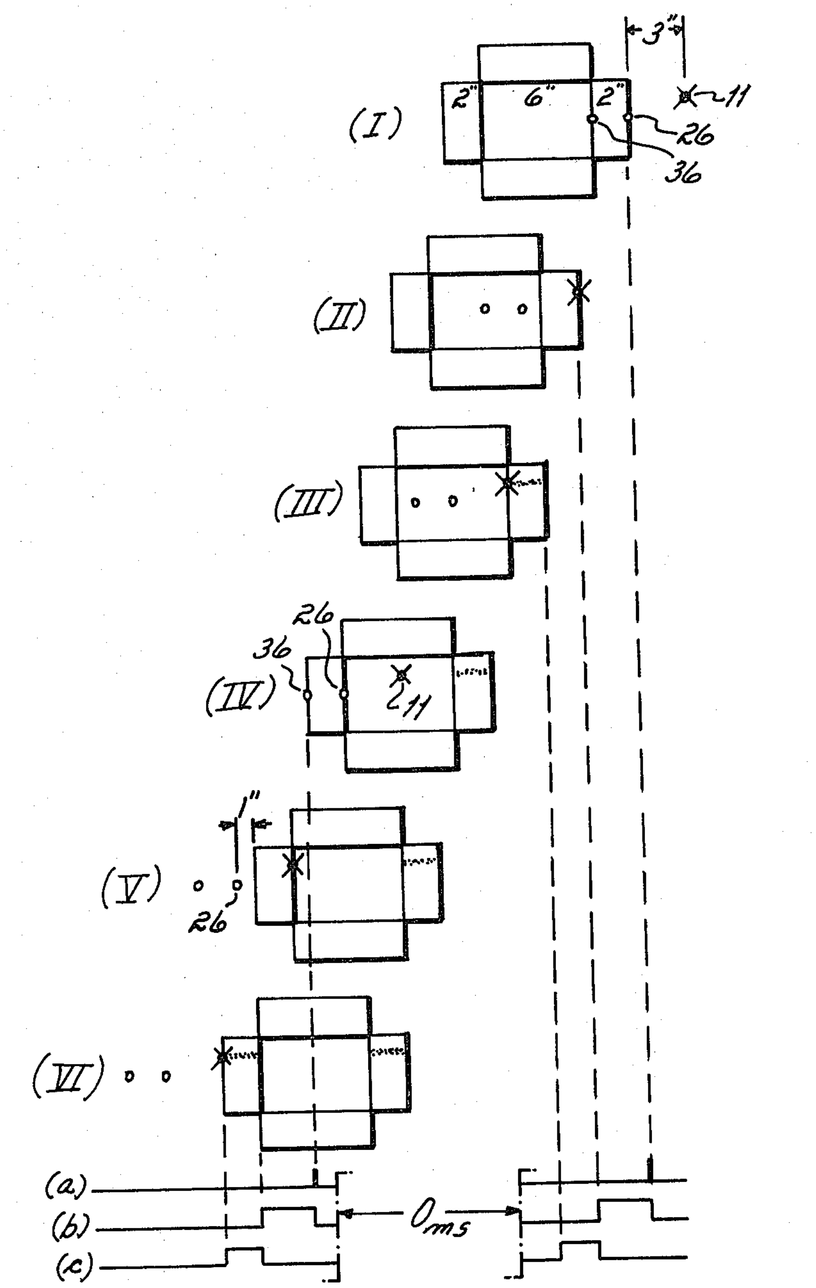
FIG. 4 is a timing diagram showing various control wave forms as a carton passes the adhesive dispensing station; and While the invention is susceptible to various modifications and alternative forms, a specific embodiment thereof, in the form of a hot melt adhesive application system, has been shown by way of example in the drawings and will herein be described in detail. It should be understood, however, that it is not intended to limit the invention to the particular form disclosed, but, on the contrary, the intention is to cover all modifications, equivalents and alternatives falling within the spirit and scope of the invention as defined by the appended claims.

In order to facilitate the understanding of these spatial relationships, an illustrative example is shown in FIG. 4. If the speed of movement of the cartons is 100 feet per minute, in 50 milliseconds a carton travels one inch. For the illustrated carton, the carton width is six inches and the leading and trailing flaps are each two inches in width. The two sensors are spaced apart a distance of two inches and the leading edge sensor is three inches upstream from the nozzle. Thus, the delay time set in the delay timer is 150 milliseconds, to allow three inches of travel, and the duration time set in the duration timer is 100 milliseconds, to allow two inches of travel. The waveform (a) shows the sensor pulse output at the output of the OR gate 29. The waveform (b) is the 150 millisecond delay time signal for each of the sensor signals, and the waveform (c) is the 100 millisecond duration time signal for each flap. The direction of increasing time for the waveforms is from right to left, and the position of the carton relative to the sensors and nozzle at each waveform transition time is illustrated in a time lapse sequence from top to bottom of the figure.

As shown in position I of FIG. 4, the photosensor 26 is at the leading edge of the leading flap, producing a sensor pulse at the OR gate output as shown in waveform (a). The trailing edge sensor 36 at this time is eight inches from the trailing edge of the trailing flap, or 400 milliseconds, from producing a sensor pulse. The delay distance is three inches, corresponding to 150 milliseconds, based upon the three inch spacing between the nozzle 11 and the leading edge sensor 26. Thus, the first delay time interval ends five inches, or 250 milliseconds, before the beginning of the second delay interval. In fact, as long as the width of the carton exceeds one inch, encompassing all practical carton configurations, there will be no delay timer overlap. Also, since the sensor 36 produces a sensor output on the trailing edge of the trailing flap of the carton, there is no theoretical upper limit imposed on the width of the carton by this system. It may be further noted that the spacing between the trailing edge of the trailing flap of a carton and the leading edge of the leading flap of the next carton must be greater than one inch. As shown in illustration V of FIG. 4, at the end of the delay time for the trailing flap, the leading edge sensor 26 is one inch behind the trailing edge of the trailing flap.

As can be seen from the positioning of the elements in illustration IV, in the illustrated system there is an additional constraint on sensor positioning that the sensors be spaced apart by a distance equal to the flap width where the adhesive bead has a duration equal to each flap width. In this case, at the time of sensing of the trailing edge of the trailing flap by the sensor 36, the sensor 26 is coincident with the leading edge of the trailing flap.

It can be noted that the time scale for the waveforms in FIG. 4 is not continuous. This is because the set of waveforms initiated by the leading edge sensor 26 is based upon the sensing of the leading edge of the leading flap. The set of trailing edge waveforms is initiated by the sensing of the trailing edge of the trailing flap by the sensor 36. Shifting between these two reference points destroys the time continuity of the Figure, but the proper time relationships are maintained by regarding the break in the time scale as being zero milliseconds.

The principles of the invention are equally applicable to systems in which a conveyor moves at a variable speed with delays and durations being established by a distance controller. In this case, a tachometer coupled to the belt drive, or other drive means, supplies carton speed information which is used to decrement delay and duration counters having preset distance counts.

In the foregoing description, the controlled valve for dispensing adhesive has been treated as instantaneously responsive to control signal application and removal. In actuality, there are pull-in and drop-out lag times which must be compensated for in the delay and duration times, respectively. To do this, the preset delay time in the delay timer is decreased to allow for the pull-in lag. Similarly, the preset duration time in the duration timer is decreased to allow for the drop-out lag.

What is claimed is:

1. A system for automatically coating objects with a plurality of quantities of a coating material comprising:

a discharge device coupled to a source of coating material;

means for discharging the coating material from the discharge device in response to a control signal;

means for moving the objects relative to the discharge device in a path past the discharge device;

a first sensor positioned along said path and operative to generate a first sensor signal in response to the presence of an object at a first point on said path upstream of said discharge device;

a second sensor positioned along said path and operative to generate a second sensor signal in response to the presence of an object at a second point on said path downstream of the first point and upstream of said discharge device;

a delay timer responsive to either of the sensor signals to produce a delay signal after a delay time corresponding to a predetermined distance of travel by a sensed object on the path;

a duration timer responsive to the delay signal to produce a duration signal for a duration time corresponding to a predetermined distance of travel by a sensed object on the path, the delay timer and the duration timer being operable to function simultaneously; and driver means for coupling a control signal to the coating material discharging means in response to the duration signal from the duration timer.

2. The system of claim 1 in which the sensors are positioned along the path such that said first point and said second point are spaced apart a distance further than the distance of travel corresponding to said delay time, reduced by a turn-on lag time of the discharging means, whereby a sensor signal from one of the sensors is not generated during the delay time corresponding to the sensor signal of the other of said sensors.

3. The system of either of claims 1 or 2 in which the first sensor is a photosensor operable to detect the leading edge of an object and the second sensor is a photosensor operable to detect the trailing edge of an object.

4. The system of claim 3 in which the first and second photosensors are spaced apart by a distance equal to the predetermined distance of travel to which the duration time, reduced by a turn-off lag time of the discharging means, corresponds.

5. A system for automatically applying adhesive to the leading and trailing flaps of cartons comprising:

an adhesive dispensing device coupled to a source of adhesive;

means for dispensing the adhesive from the dispensing device in response to a control signal;

means for moving the cartons relative to the dispensing device in a path past the dispensing device;

a first photosensor positioned along said path and operative to generate a first sensor signal in response to the presence of the leading edge of the leading flap when the carton is at a first point on said path upstream of said dispensing device;

a second sensor positioned along said path and operative to generate a second sensor signal in response to the trailing edge of the trailing flap of a carton when the carton is at a second point on said path downstream of the first point and upstream of the dispensing device;

a delay timer responsive to either of the sensor signals to produce a delay signal after a delay time corresponding to a predetermined distance of travel by a carton on the path;

a duration timer responsive to the delay signal to produce a duration signal for a duration time corresponding to a predetermined distance of travel by a carton on the path, the delay timer and the duration timer being operable to function simultaneously; and driver means for coupling a control signal to the adhesive dispensing means in response to the duration signal from the duration timer.

* * * * *